(12) United States Patent
Zhu et al.

(10) Patent No.: US 9,121,788 B2
(45) Date of Patent: Sep. 1, 2015

(54) DEVICE AND METHOD FOR DETECTING OPTICAL PERFORMANCE OF BEAM SHAPING ELEMENT

(75) Inventors: Jing Zhu, Shanghai (CN); Huijie Huang, Shanghai (CN); Aijun Zeng, Shanghai (CN); Zhonghua Hu, Shanghai (CN); Baoxi Yang, Shanghai (CN); Ming Chen, Shanghai (CN)

(73) Assignee: Shanghai Institute of Optics And Fine Mechanics, Chinese Academy of Sciences, Shanghai (CN)

( * ) Notice: Subject to any disclaimer, the term of this patent is extended or adjusted under 35 U.S.C. 154(b) by 0 days.

(21) Appl. No.: 14/125,581

(22) PCT Filed: Jun. 28, 2011

(86) PCT No.: PCT/CN2011/001063
§ 371 (c)(1),
(2), (4) Date: Dec. 12, 2013

(87) PCT Pub. No.: WO2012/174683
PCT Pub. Date: Dec. 27, 2012

(65) Prior Publication Data
US 2014/0132952 A1 May 15, 2014

(30) Foreign Application Priority Data
Jun. 21, 2011 (CN) .......................... 2011 1 0167236

(51) Int. Cl.
*G01M 11/02* (2006.01)
*G03F 7/20* (2006.01)
(Continued)

(52) U.S. Cl.
CPC ........... *G01M 11/02* (2013.01); *B23K 26/0656* (2013.01); *B23K 26/426* (2013.01);
(Continued)

(58) Field of Classification Search
CPC ............... G03F 7/706; G03F 7/70591; G01M 11/0228; G01M 11/0264; G01M 11/0214; G01M 11/0235; G01M 11/0207; G01M 11/0257; G01M 11/0242; G01B 11/255; G01B 11/24; G02B 27/0025; G02B 27/0012; G02B 27/58; G01N 2021/9583; G01J 9/00
USPC .................. 356/124, 127, 125, 124.5, 239.2, 356/300–334, 420–425
See application file for complete search history.

(56) References Cited

U.S. PATENT DOCUMENTS 6,433,301 B1 * 8/2002 Dunsky et al. ........... 219/121.67
2002/0001088 A1 1/2002 Wegmann et al.
(Continued)

FOREIGN PATENT DOCUMENTS

CN 1595078 A 3/2005
CN 1693866 A 11/2005
(Continued)

OTHER PUBLICATIONS
https://spie.org/Documents/Publications/00%20STEP%20Module%2004.pdf.*
(Continued)

*Primary Examiner* — Tarifur Chowdhury
(74) *Attorney, Agent, or Firm* — Manni Li; Mei & Mark LLP

(57) ABSTRACT

A detection apparatus and method for testing optical performance of beam shaping element used in ultraviolet lithography machine; The apparatus comprises visible wavelength laser and other optical units placed along the optical axis including, in order from laser side, (a) beam expander lens group, (b) beam splitter, (c) first far field imaging lens, (d) adjustable aperture or (e) CCD image sensor, (f) second far field imaging lens and (g) energy sensor. The detection apparatus is suitable be employed to detect the optical performance of beam shaping element working at any ultraviolet band, and provides the features of low cost, easy operation and quick measurement.

10 Claims, 1 Drawing Sheet

(51) Int. Cl.
*G02B 19/00* (2006.01)
*B23K 26/06* (2014.01)
*B23K 26/30* (2014.01)

(52) U.S. Cl.
CPC .......... *B23K26/428* (2013.01); *G02B 19/0014* (2013.01); *G02B 19/0052* (2013.01); *G02B 19/0095* (2013.01); *G03F 7/70108* (2013.01); *G03F 7/70591* (2013.01)

(56) References Cited

U.S. PATENT DOCUMENTS

| | | |
|---|---|---|
| 2005/0259269 A1 | 11/2005 | Latypov et al. |
| 2006/0007448 A1* | 1/2006 | Hwang et al. ................. 356/512 |
| 2006/0210911 A1 | 9/2006 | Yamazoe et al. |
| 2007/0002474 A1 | 1/2007 | Amemiya et al. |
| 2013/0094077 A1* | 4/2013 | Brueck et al. ................. 359/385 |
| 2014/0333923 A1* | 11/2014 | Taniguchi et al. ......... 356/237.5 |
| 2015/0090908 A1* | 4/2015 | Lippert et al. ........... 250/559.07 |

FOREIGN PATENT DOCUMENTS

| | | |
|---|---|---|
| CN | 102735428 B * | 10/2014 |
| EP | 1594007 A2 | 11/2005 |

OTHER PUBLICATIONS

Espacenet English translation of document CN 102735428 B.*
John E. Childers et al., "Advanced Testing Requirements of Diffractive Optical Elements for Off-Axis Illumination in Photolithography," Proceeding of SPIE, vol. 7430, pp. 74300S-74300S-8 (Aug. 20, 2009).
Yu, Daoyin et al., "Engineering Optics," Second Edition, Mechanical Industry Press, pp. 345 and 366 (2005).

* cited by examiner

DEVICE AND METHOD FOR DETECTING OPTICAL PERFORMANCE OF BEAM SHAPING ELEMENT

CROSS-REFERENCE AND RELATED APPLICATIONS

The subject application is a national stage of PCT international application PCT/CN2011/001063 filed on Jun. 28, 2011, which in turn claims priority on Chinese patent application No. CN 201110167236.0 filed on Jun. 21, 2011. The contents and subject matter of the PCT and Chinese priority applications are incorporated herein by reference.

FIELD OF THE INVENTION

The invention relates to micro lithography field, especially a detection apparatus and method for testing optical performance of a beam shaping element in ultraviolet lithography machine illumination system.

BACKGROUND

In advanced lithography machine illumination system, beam shaping elements are used to realize off-axis illumination, which enhances lithography system resolution, enlarges depth of focus, and improves lithography contrast and quality.

Lithography system resolution is the minimum line width that a lithography machine can fabricate on a silicon wafer, it is proportional to light source wavelength. Recently, lithography systems mainly use ultraviolet or deep-ultraviolet laser as the light source (ultraviolet wavelength range: mercury lamp i line wavelength at 365 nm, deep-ultraviolet wavelength range: argon fluoride (ArF) laser wavelength at 193 nm, and krypton fluoride (KrF) laser wavelength at 248 nm. In this invention, we use "ultraviolet" to instead of "ultraviolet and deep-ultraviolet" for simplicity). Short light wavelength is benefit for decreasing critical line dimension and increasing the integration degree of electronic device (such as central process unit (CPU), static memory and etc). Due to the choice of wavelength of light source, the beam shaping element in illumination system is also working at ultraviolet wavelength.

In order to realize exact off-axis illumination mode and high energy efficiency, diffractive optical method is usually adopted for the beam shaping element. Prior to assemble the beam shaping element on the illumination system, its optical performance should be tested. Designed and fabricated beam shaping element requires not only off-axis illumination capability, but also as high energy efficiency as possible by minimizing the energy lose at illumination mode change process. Therefore, the optical performance tests on beam shaping elements comprise far field optical intensity distribution and energy efficiency.

In the existing testing methods, ultraviolet laser, ultraviolet CCD image sensor and ultraviolet energy sensor with the same working as that of beam shaping element, are used to install the testing system (John E Childers, Tom Baker, Tim Emig, James Carriere, Marc D. Himel, Proc. of SPIE Vol. 7430, 74300S, 2009). In the testing system, the output beam of beam shaping element is detected by ultraviolet CCD imaging camera at far field (the focal plane of far field imaging lens), and the output beam is focused on the ultraviolet energy sensor to detect the energy efficiency. The disadvantages of the existing technology includes: the testing system is working at ultraviolet wavelength, which results non-convenient optical path adjustment; the ultraviolet laser, the ultraviolet CCD image sensor and the ultraviolet energy sensor used in testing system are very expensive; the ultraviolet laser uses fluorine-containing mixed gas, which is strongly corrosive and toxic; The ultraviolet light beam cannot be seen by human eyes, which results in difficult optical path alignment and adjustment.

SUMMARY OF THE INVENTION

The invention is a detection apparatus and method for testing optical performance of a beam shaping element. The detection apparatus and method can be employed to detect the optical performance of beam shaping element working at any ultraviolet band, and provides the features of low cost, easy operation use and quick measurement.

The current invention provides a technical solution as follows:

A detection apparatus for testing optical performance of a beam shaping element used in an ultraviolet lithography machine comprising a visible wavelength laser and the following optical units placed along the laser direction and along the optical axis of the laser in the following sequence, a beam expander lens group, a beam splitter, a first far field imaging lens, an adjustable aperture or a CCD image sensor, a second far field imaging lens and a second energy sensor.

In the apparatus, the beam splitter is designed to have an angle of 45° to the optical axis. At the reflection direction of the beam splitter, a first energy sensor is located to detect the input beam energy.

The test-beam shaping element is located at object focal plane of the first far field imaging lens. Focal length of both the first far field imaging lens and the second far field imaging lens are f. The distance between the first far field imaging lens and the second far field imaging lens is 2f. The second energy sensor is located at image focal plane of the second far field imaging lens.

At the common focal plane of the first far field imaging lens and the second far field imaging lens, there is the adjustable aperture or the CCD image sensor. In the middle of photosensitive surface of the CCD image sensor, there is a central obscuration.

At the object focal plane of the first far field imaging lens, there has an adjustable frame to install the beam shaping element.

At the common focal plane of the first far field imaging lens and the second far field imaging lens there is an interchange unit to control the exchange of the CCD image sensor (containing the central obscuration) and the adjustable aperture. When said interchange unit is working, the CCD image sensor and the adjustable aperture will change their position, and one of the two components is located along the optical axis of the optical path, the other one is outside the optical path.

The beam splitter is a half transmission and half reflection mirror.

In addition, the present invention is also related to a detection method using the above described detection apparatus for testing optical performance of a beam shaping element comprising in the listed sequence 1) Detection of Far Field Optical Intensity Distribution ① The CCD image sensor is located at the optical path by using the interchange unit.

② The visible wavelength laser is turned on, followed by beam expander lens group adjustment to expand the output beam of the visible wavelength laser to the dimension as same as the aperture of the beam shaping element. In the following, the beam passed square pinhole aperture and the beam splitter, and splits into reflection beam and transmission beam.

The transmission beam is illuminated on the beam shaping element, and then the far field optical intensity distribution is detected by the CCD image sensor to receive the optical far field distribution size D':

$$D' = 2\lambda' f/d$$

where f is the focal length of the first far field imaging lens and the second far field imaging lens, d is the minimum cell size of the beam shaping element, $\lambda'$ is the visible light wavelength.

③ The size of far field distribution at ultraviolet working wavelength ($\lambda$) has the relationship with that at visible wavelength by $D = D'\lambda/\lambda'$.

2) Detection of Energy Efficiency:
① Measurement of zeroth-order diffractive efficiency at visible wavelength ($\lambda'$)

The adjustable aperture is turned to its minimum size to only let zeroth-order diffractive light pass. The zeroth-order light intensity $I_0'$ is measured by the second energy sensor, and at the same time the input light intensity $I_{in}$ is measured by the first energy sensor. The phase number N of the beam shaping element is calculated by the equation:

$$\eta_0' = I_0'/I_{in} = \left[\frac{1}{N} \cdot \frac{\sin(\pi c/b)}{\sin(\pi c/bN)}\right]^2$$

where $c/b = \lambda/\lambda'$.

② Measurement of first-order diffractive efficiency at visible wavelength ($\lambda'$)

The adjustable aperture is turned to the size as same as that of the far field distribution D'. The zeroth-order and first-order light intensity $I_{0+1}'$ is measured by the second energy sensor, and at the same time the input light intensity $I_{in}$ is measured by the first energy sensor, first-order diffractive efficiency $\eta_1'$ is calculated by the equation:

$$\eta_1' = (I_{0+1}' - I_0')/I_{in}.$$

③ first-order diffractive efficiency ($\eta_1$) of the beam shaping element at the ultraviolet working wavelength ($\lambda$) is calculated by $$\eta_1'/\eta_1 = \left\{\frac{1}{N} \cdot \frac{\sin\pi(1 - c/b)}{\sin[\pi(1 - c/b)/N]}\right\}^2.$$

It is an advantage of this invention that visible light was used to test the optical performance of beam shaping element installed in ultraviolet lithography illumination system to detect its far field optical intensity distribution and energy efficiency. The laser, the CCD image sensor and the energy sensor used in the detection apparatus are all working at visible light wavelength range. Their price is much lower than those working at ultraviolet light wavelength range and the optical path modification is convenient and safe under visible wavelength light.

It is a further advantage of this invention that it is suitable for the optical performance test of all ultraviolet beam shaping element, not only limit for single wavelength. In addition, this invention has the features of low cost, easy operation and quick measurement.

DESCRIPTION OF THE PREFERRED EMBODIMENT

Additional descriptions of the invention are presented combining with the drawings and embodiment. These descriptions are not the limitation of the protection range for the invention.

Figure 1:
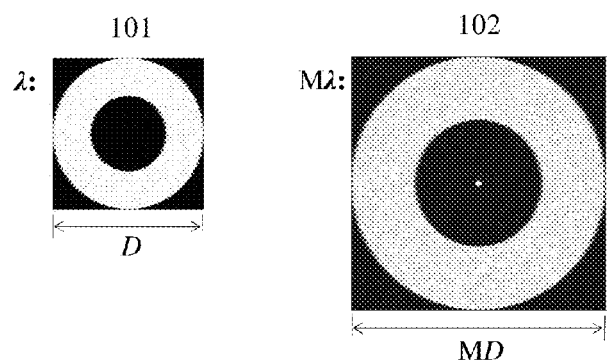
FIG. 1 shows the simulation result that is the far field optical intensity distributions of a same beam shaping element working at two different wavelengths.

In FIG. 1, the annular far field optical intensity distribution generated by beam shaping element in ultraviolet lithography machine is shown as an example. As the result of simulation, when the wavelength of input light source changes, far field optical intensity distribution will change. For example, at wavelength $\lambda = 248$ nm, far field optical intensity distribution of the beam shaping element is annular distribution shown as 101. Its outside diameter is D=20 mm. The aperture size of the beam shaping element is 10 mm×10 mm. Based on the computer simulation, it can be found that when the input beam wavelength is changed to $\lambda' = M\lambda$ (M>1), the outside diameter of far field optical intensity distribution 102 enlarges M times, while its shape does not change. Moreover, in the middle of the far field optical intensity distribution a strong light spot appears.

By the principle of Fraunhofer diffraction theorem, if we neglect the refractive index change at difference wavelength (the change is very small usually), the outside dimension D of far field optical intensity distribution is proportional to wavelength $\lambda$ (Yu Daoyin, Tan Hengying, Engineering Optics (Second Edition), Mechanical Industry Press, 2005, P345, in Chinese):

$$D = 2\lambda f/d$$

where, f is the focal length of far field imaging lens, d is the lateral dimension of the cells of beam shaping element. From the above equation, it can be found that the outside dimension D of far field optical intensity distribution is proportional to wavelength $\lambda$.

Therefore, it is proved by the simulation result and theoretical analysis that testing the optical performance of beam shaping element at the wavelength different with its working wavelength is practicable. This is the basis of this invention. In the testing process of this invention, the central light spot should be blocked. Because the intensity of this light spot is too high to saturate and even destroy the CCD. After the central obscuration is installed before CCD, the far field optical intensity distribution is measured by CCD imaging camera. Finally, the far field optical intensity distribution at ultraviolet wavelength is received by shrinking the measured distribution at the ratio of $\lambda'/\lambda$, where $\lambda'$ is the visible wavelength used in measurement, $\lambda$ is the ultraviolet working wavelength.

The equations used for energy efficiency test are deduced in the following:

The diffractive optical element is used for beam shaping, and it is a phase grating consisting of multiple step-like reliefs. The intensity of every diffractive order is (Yu Daoyin, Tan Hengying, Engineering Optics (Second Edition), Mechanical Industry Press, 2005, P366, in Chinese):

$$I_m = \left\{A_0 \frac{\sin(m\pi/N)}{m\pi} \cdot \frac{\sin\pi(m - h(n-1)/\lambda)}{\sin[\pi(m - h(n-1)/\lambda)/N]}\right\}^2.$$

where $A_0$ is input light amplitude, m is the diffractive order, $I_m$ is the intensity of m diffractive order, N is the phase number, h is the maximum step height, λ is the input laser wavelength, n is material refractive index at wavelength λ.

As indicated in this equation, when the input laser wavelength changed, the intensity of each diffractive order will change correspondingly. In generally, the beam shaping element is designed in accordance with 2π phase difference, which means h=λ/(n−1), λ is the working wavelength of beam shaping element. However, in actual fabrication process, there is small deviation Δh to the step height h due to the fabrication error. For the beam shaping element, useful energy is concentrated in first-order diffraction, which means m=1.

Based on the above equation, at the working wavelength λ, the first-order energy efficiency can be expressed by:

$$\eta_1 = I_1/I_{in} = \left[\frac{\sin(\pi/N)}{\pi} \cdot \frac{\sin\pi b}{\sin(\pi b/N)}\right]^2$$

At the testing wavelength λ', the first-order energy efficiency can be expressed by:

$$\eta'_1 = I'_1/I_{in} = \left\{\frac{\sin(\pi/N)}{\pi} \cdot \frac{\sin\pi(1-c/b+c)}{\sin[\pi(1-c/b+c)/N]}\right\}^2$$

where, b=Δh(n−1)/λ, c=Δh(n'−1)/λ'. n' is the material refractive index at wavelength λ'. Here, we assume that and divide n'≈n and divide $\eta'_1$ by $\eta_1$. Considering the fabrication deviation Δh is much smaller than wavelength λ and λ', which results in the value of b and c are very close to zero, the ratio of energy efficiency can be received after simplification:

$$\eta'_1/\eta_1 = \left\{\frac{1}{N} \cdot \frac{\sin\pi(1-c/b)}{\sin[\pi(1-c/b)/N]}\right\}^2$$

where, c/b=λ/λ', and N is the phase number of beam shaping element. Phase number is the equally division number of the phase 0~2π of the beam shaping element. This phase number can be received from the measurement of the zeroth-order diffraction efficiency. At the testing wavelength λ', zeroth-order diffraction efficiency is:

$$\eta'_0 = I'_0/I_{in} = \left[\frac{1}{N} \cdot \frac{\sin(\pi c/b)}{\sin(\pi c/bN)}\right]^2$$

Figure 2:
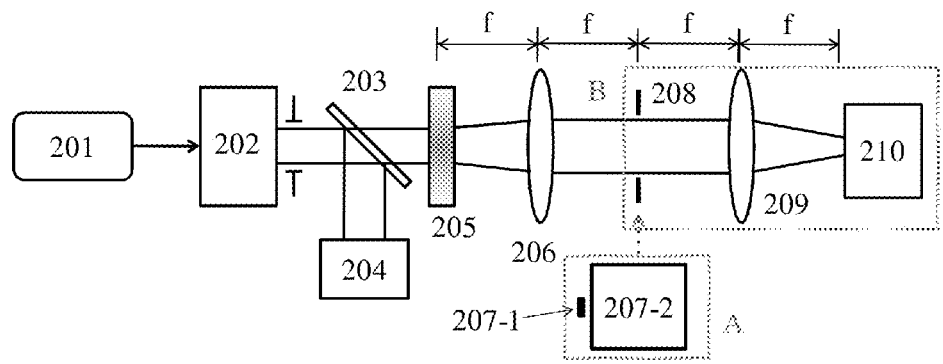
FIG. 2 shows the schematic of the detection apparatus used to test the optical performance of beam shaping element.

FIG. 2 shows the invention, which is a detection apparatus for testing optical performance of a beam shaping element. This apparatus comprise visible wavelength laser 201 and other optical units placed along the optical axis including, in order from laser 201 side, beam expander lens group 202, beam splitter 203, first far field imaging lens 206, adjustable aperture 208, second far field imaging lens 209 and second energy sensor 210.

In the apparatus, a beam splitter 203 is with 45° to the optical axis. At the reflection direction of the beam splitter 203 there is a first energy sensor 204 to detect the input beam energy.

The under-tested beam shaping element 205 is located at object focal plane of the first far field imaging lens 206. Focal length of both the first far field imaging lens 206 and the second far field imaging lens 207 is f. The distance between the first far field imaging lens 206 and the second far field imaging lens 207 is 2f. The second energy sensor 210 is located at image focal plane of the second far field imaging lens 209.

At the common focal plane of the first far field imaging lens 206 and the second far field imaging lens 209, there is the adjustable aperture 208 or the CCD image sensor 207-2. In the middle of photosensitive surface of the CCD image sensor 207-2, there is a central obscuration 207-1.

At the object focal plane of the first far field imaging lens 206, there has an adjustable frame to fix the beam shaping element 205.

At the common focal plane of the first far field imaging lens 206 and the second far field imaging lens 209 there is an interchange unit to control the exchange of said CCD image sensor 207-2 (containing said central obscuration 207-1) and said adjustable aperture 208. When said interchange unit working, said CCD image sensor 207-2 and said adjustable aperture 208 will change their position, and one of the two components is located along the optical axis of the optical path, the other one is outside the optical path.

The embodiment is shown in the following to describe the whole detection apparatus components, light path construction and detection method.

Firstly, a visible wavelength laser 201 such as 632.8 nm He—Ne laser is chosen. The laser outside diameter is about 0.5 mm. A beam expander 202 is located after the laser to expand the laser beam diameter to at least the aperture of beam shaping element 205 about 14.14 mm, which is the diameter of the diagonal calculated by 10 mm.times.{square root over (2)}. Then the expanded beam is cut out by a square aperture with the size of 10 mm.times.10 mm before illuminating on the beam shaping element 205. A beam splitter 203 is a half transmission and half reflection mirror. The half reflection light was detected by the first energy sensor 204, whose detection diameter should be bigger than 14.14 mm, while the half transmission light was vertically illuminated on the beam shaping element 205. The above light path is shared, while subsequent light path has two cases: "A" light path is used to test the far field optical intensity distribution; "B" light path is used to test the energy efficiency. Two cases are described separately bellow.

In "A" light path, a 2-f measurement system to test the far field light intensity distribution of beam shaping element is used. The 2-f measurement system comprises: the beam shaping element 205 located at the front focal plane of the first far field imaging lens 206, and the CCD image sensor 207-2 located at the back focal plane of the first far field imaging lens 206. In order to ensure the far field imaging to be fully detected by the CCD image sensor 207-2, the focal length of the first far field imaging lens 206 should be carefully chosen according to CCD size of the CCD image sensor 207-2 based on the equation:

$$f < l/2NA$$

where, l is the CCD size and NA is the output numerical aperture of the beam shaping element 205. On the other hand, according to the diffraction law, NA is dependent with the lateral size of the phase step of the beam shaping element 205 and the laser wavelength λ:

$$NA = \lambda/d$$

Combining the above two equations, the focal length of the first far field imaging lens 206 should satisfy:

$$f < l \cdot d/2\lambda$$

In the embodiment, the CCD size l is 12 mm, the laser wavelength is 632.8 nm, and the lateral size of the phase step d is 5 μm. According to equation, f can be chosen as 40 mm.

In FIG. 2, in the middle of photosensitive surface of the CCD image sensor 207-2, there is a central obscuration 207-1 to block the central light spot. The area ratio of the central obscuration to the CCD photosensitive area should be less than 0.05. In this embodiment, a 0.5 mm diameter round central obscuration is used.

The test procedure of the far field optical intensity distribution is as following:

① The CCD image sensor together with the central obscuration is located at the optical path by using the interchange unit.

② The visible wavelength laser is turned on, followed by beam expander lens group adjustment to expand the output beam of the visible wavelength laser to the dimension as same as the aperture of the beam shaping element 14.14 mm (the diameter of the diagonal is 10 mm×√2). In the following, the beam passed square aperture to be size of 10 mm×10 mm. After that the beam splitter 203 is used to split the beam into reflection beam and transmission beam. The transmission beam is illuminated on the beam shaping element 205, and then the far field optical intensity distribution is detected by the CCD image sensor 207-2.

③ The size of far field distribution at ultraviolet working wavelength ($\lambda$) is shrunk by the ratio of $\lambda'/\lambda$. The working wavelength of beam shaping element is 248 nm, so the shrink ration is 2.55. The reduced far field optical intensity distribution is the far field optical intensity distribution at ultraviolet working wavelength.

In FIG. 2, "B" light path is used to test the energy efficiency of the beam shaping element 205. In the "B" light path, a 4-f measurement system is applied as: the first far field imaging lens 206 and the second far field imaging lens 209 are located in the light beam; the beam shaping element 205 is located at the front focal plane of the first far field imaging lens 206; the adjustable aperture 208 is located at the back focal plane of the first far field imaging lens 206 and front focal plane of the second far field imaging lens 209; the second energy sensor 210 is located at the back focal plane of the second far field imaging lens 209. The focal length f of two far field imaging lenses are the same. The distance from the beam shaping element 205 to the second energy sensor 210 is 4f. This is the reason why this optical path called 4f measurement system. The adjustable aperture 208 is in the same position of the CCD image sensor 207-2 in "A" light path. The focal length of the first far field imaging lens 206 is same as that in "A" light path.

The test procedure of energy efficiency is as following:

① The adjustable aperture 208 is located at the optical path by using the interchange unit.

② The visible wavelength laser 201 is turned on, followed by beam expander lens group 202 adjustment to expand the output beam of the visible wavelength laser to the dimension as same as the aperture of the beam shaping element 14.14 mm (the diameter of the diagonal is 10 mm×√2). In the following, the beam passed square aperture to be size of 10 mm×10 mm. After that the beam splitter 203 is used to split the beam into reflection beam and transmission beam. The transmission light is illuminated on the beam shaping element 205.

③ Measurement of zeroth-order diffractive efficiency at visible wavelength

The adjustable aperture 208 is turned to its minimum size (in this embodiment is 0.3 mm) to only let central light pass. After passing through the beam expander 202 and reflected by the beam splitter 203, the laser was detected by the first energy sensor 204 to measure the input laser beam energy $I_{in}$. The transmission beam from the beam splitter 203, illuminating on the beam shaping element 205, subsequently passing through the first far field imaging lens 206, and finally the adjustable aperture 208 and the second far field imaging lens 209, is detected by the second energy sensor to measure the zeroth-order light intensity $I_0'$. The zeroth-order diffraction energy efficiency is calculated by $\eta_0' = I_0'/I_{in}$.

④ Calculation of the phase number N of the beam shaping element by using the equation:

$$\eta_0' = I_0'/I_{in} = \left[\frac{1}{N} \cdot \frac{\sin(\pi c/b)}{\sin(\pi c/bN)}\right]^2$$

where $c/b = \lambda/\lambda'$, $\lambda$ is the ultraviolet wavelength, $\lambda'$ is the visible wavelength of the light using in the measurement, sin is the Sine function, and $\pi$ is a mathematical constant. In the embodiment, $\lambda = 248$ nm, $\lambda' = 632.8$ nm, so $c/b = 0.3919$. The phase number N is calculated by the above equation, and it is an integer (usually $2^n$, such as 2, 4, 8 and et. al). In the embodiment, $\eta_0'$ is measured as 59.12%, which results in N for 8.

⑤ Measurement of first-order diffractive efficiency at visible wavelength ($\lambda'$)

The adjustable aperture 208 is turned to the size as same as that of the far field distribution D'. The zeroth-order and first-order light intensity $I_{0+1}'$ is measured by the second energy sensor 210, and at the same time the input light intensity $I_{in}$ is measured by the first energy sensor 204. first-order diffractive efficiency $\eta_1'$ is calculated by the equation:

$$\eta_1' = (I_{0+1}' - I_0')/I_{in}.$$

⑥ first-order diffractive efficiency ($\eta_1$) of the beam shaping element at the ultraviolet working wavelength ($\lambda$) is calculated by $$\eta_1'/\eta_1 = \left\{\frac{1}{N} \cdot \frac{\sin\pi(1-c/b)}{\sin[\pi(1-c/b)/N]}\right\}^2.$$

where, N is the phase number of the beam shaping element and $c/b = \lambda/\lambda'$. In the embodiment, when the phase number N is 8, $\eta_1'/\eta_1 = 0.248$. Then inputting the energy efficiency $\eta_1'$ at test visible wavelength measured in ⑤, we can receive the energy efficiency $\eta_1$ at the working ultraviolet wavelength.

Test wavelength selection should follow the principles: test wavelength $\lambda'$ should be longer than working ultraviolet wavelength $\lambda$, and $\lambda'/\lambda$ is preferred to be 2~4. Because from the above equation, when $\lambda'/\lambda = 4$, we can get $\eta_1'/\eta_1 = 0.09$, which means the ration of the two energy efficiencies is higher than 10. The reliability of the measurements is close to its limitation.

It is a feature of this invention that visible light was used to test the optical performance of beam shaping element installed in ultraviolet lithography illumination system to detect its far field optical intensity distribution and energy efficiency. This invention has additional features such as low cost, easy operation and quick measurement.

What is claimed is:

1. A device for detecting optical performance of a beam shaping element, comprising
    a visible wavelength laser having a laser output direction and an optical axis,
    a beam expander lens group following the visible wavelength laser on the optical axis and on the laser output direction, a beam splitter on the laser output direction and on the optical axis following the beam expander lens group, said beam splitter being inclined at an angle of 45° to the optical axis whereby an incoming laser output is divided into a transmission beam and a reflection beam, a first energy sensor being arranged at a reflection direction of the beam splitter for detecting the reflection beam from the beam splitter, a first far field imaging lens having a front object focal plane and a back image focal plane and being positioned on the optical axis following the beam splitter, a second far field imaging lens being positioned on the optical axis and having a front object focal plane, which is common to the back image focal plane of the first far field imaging lens, and a back image focal plane, an adjustable aperture on the optical axis following the first far field imaging lens, a CCD image sensor being interchangeable with the adjustable aperture through an interchange unit, for detecting a far field optical intensity distribution of the transmission beam, the CCD image sensor having a central obscuration in middle of its photosensitive surface, the interchange unit being arranged at the common focal plane of the first far field imaging lens and the second far field imaging lens for interchanging the CCD image sensor and the adjustable aperture, a second energy sensor on the optical axis and being located at the back image focal plane of the second far field imaging lens for detecting a beam from the second far field imaging lens, wherein the beam shaping element is placed at the front object focal plane of the first far field imaging lens between the beam splitter and the first far field imaging lens, f, the first far field imaging lens and the second far field imaging lens have a same focal length f, a distance between the first far field imaging lens and the second far field imaging lens is 2f; and the adjustable aperture and the CCD image sensor are interchangeably arranged at the common focal plane of the first far field imaging lens and the second far field imaging lens.

2. The device according to claim 1, further comprising
an adjustable frame being arranged at the front object focal plane of the first far field imaging lens for installing the beam shaping element.

3. The device according to claim 1,
wherein when the interchange unit performs the interchange, the CCD image sensor and the adjustable aperture have an interchanged position, and either the CCD image sensor or the adjustable aperture has a center on the optical axis of the optical path.

4. The device according to claim 1, wherein the beam splitter is a half transmission and half reflection mirror.

5. A method for detecting a far field optical intensity distribution of a beam shaping element by using the device as described in claim 1, comprising
arranging the CCD image sensor on the optical path by using an interchange unit;
turning on the visible wavelength laser, adjusting the beam expander lens group to expand the output beam of the visible wavelength laser to have the same dimension as an aperture of the beam shaping element, intercepting the beam by using a square aperture, passing the beam through the beam splitter to divide the beam into a reflection beam and a transmission beam, having the transmission beam projected on the beam shaping element, detecting the transmission beam by using the CCD image sensor, and calculating an optical far field distribution size D' by using the formula:

$$D'=2\lambda'f/d$$

wherein f is the focal length of the first far field imaging lens and the second far field imaging lens, d is a minimum cell size of the beam shaping element, $\lambda'$ is a visible light wavelength; and calculating the optical far field distribution size at ultraviolet working wavelength $\lambda$ by using the formula: $D=D'\lambda/\lambda'$.

6. A method for detecting an energy efficiency of a beam shaping element by using the device as described in claim 1, comprising
arranging the adjustable aperture on the optical path;
measuring a zeroth-order diffractive efficiency $\eta_0'$ at visible wavelength $\lambda'$: adjusting an aperture size of the adjustable aperture so as to only allow zeroth-order diffractive light to pass through, measuring a zeroth-order light intensity $I_0'$ by using the second energy sensor while measuring an input light intensity $I_{in}$ by using the first energy sensor, and calculating a phase number N of the beam shaping element by using the formula:

$$\eta_0' = I_0'/I_{in} = \left[\frac{1}{N} \cdot \frac{\sin(\pi c/b)}{\sin(\pi c/bN)}\right]^2$$

wherein $c/b=\lambda/\lambda'$, $\lambda$ is ultraviolet working wavelength;
measuring a first-order diffractive efficiency $\eta_1'$ at visible wavelength $\lambda'$; adjusting the aperture size of the adjustable aperture equal to the optical far field distribution size D', measuring a total intensity $I_{0+1}'$ by using the second energy sensor while measuring the input light intensity $I_{in}$ by using the first energy sensor, and calculating a first-order diffractive efficiency $\eta_1'$ by using the formula:

$$\eta_1'=(I_{0+1}'-I_0')/I_{in};\text{ and}$$

calculating a first-order diffractive efficiency $\eta_1$ of the beam shaping element at ultraviolet working wavelength $\lambda$ by using the formula:

$$\eta_1'/\eta_1 = \left\{\frac{1}{N} \cdot \frac{\sin\pi(1-c/b)}{\sin[\pi(1-c/b)/N]}\right\}^2.$$

7. The device according to claim 1, wherein the beam expander lens group comprises a beam expander that expands a diameter of the visible wavelength laser to at least a size of the aperture of the beam shaping element.

8. The device according to claim 1, further comprising
a square aperture on the optical axis between the beam expander lens group and the beam splitter for cutting out an expanded beam from the beam expander lens group to a squared shape before reaching the beam splitter and illuminating on the beam shaping element.

9. The device according to claim 1, wherein a detection diameter of the first energy sensor is bigger than the aperture of the beam shaping element.

10. The device according to claim 1, wherein the focal length f of the first far field imaging lens is selected to satisfy:

$$f<l\cdot d/2\lambda,$$

wherein l is a CCD size of the CCD image sensor; d is a lateral size of a phase step of the beam shaping element; and λ is a wavelength of the visible wavelength laser.

* * * * *